(12) United States Patent
Yueh et al.

(10) Patent No.: US 10,690,973 B2
(45) Date of Patent: Jun. 23, 2020

(54) ELECTRONIC DEVICE

(71) Applicant: InnoLux Corporation, Miao-Li County (TW)

(72) Inventors: Jui-Jen Yueh, Miao-Li County (TW);
Kuan-Feng Lee, Miao-Li County (TW); Chandra Lius, Miao-Li County (TW); Yuan-Lin Wu, Miao-Li County (TW)

(73) Assignee: INNOLUX CORPORATION, Chu-Nan, Miao-Li County (TW)

( * ) Notice: Subject to any disclaimer, the term of this patent is extended or adjusted under 35 U.S.C. 154(b) by 108 days.

(21) Appl. No.: 15/875,523

(22) Filed: Jan. 19, 2018

(65) Prior Publication Data
US 2019/0227361 A1    Jul. 25, 2019

(51) Int. Cl.
*G02F 1/1333* (2006.01)
*G02F 1/1345* (2006.01)
(Continued)

(52) U.S. Cl.
CPC .......... *G02F 1/1345* (2013.01); *H01L 23/481* (2013.01); *H01L 27/3234* (2013.01);
(Continued)

(58) Field of Classification Search
CPC ............. G02F 1/1345; G02F 1/133305; G02F 1/13454; G02F 2001/133302;
(Continued)

(56) References Cited

U.S. PATENT DOCUMENTS 10,123,424 B1 * 11/2018 Lee .................. H05K 1/0278
2012/0258773 A1   10/2012 Alvarez Rivera et al.
(Continued)

OTHER PUBLICATIONS

Definition of the term "device." Downloaded from the Oxford English Dictionary, Lexico on Oct. 18, 2019 from the website https://www.lexico.com/en/definition/device. (Year: 2019).*
(Continued)

*Primary Examiner* — Angela K Davison
(74) *Attorney, Agent, or Firm* — Muncy, Geissler, Olds & Lowe, P.C.

(57) ABSTRACT

An electronic device is disclosed, which includes a substrate having a first surface and a second surface opposite to the first surface, wherein the substrate has a thickness t and a width WS; a first hole penetrating through the substrate, wherein the first hole has a first area A1' on the first surface and a second area A1 on the second surface; and a second hole penetrating through the substrate, wherein the second hole has a third area A2' on the first surface and a fourth area A2 on the second surface, and a distance d is between the first hole and the second hole, wherein values of t, WS, A1', A1, A2', A2, and d are conformed to the following equation (I):

$$\frac{N \times \log((A1' + A1 + A2 + A2')/2)}{t} \leq \qquad (I)$$

$$d < WS - \frac{N \times \log(A1' + A1 + A2 + A2')}{t}$$

wherein N is greater than 0 and less than 1E6.

16 Claims, 10 Drawing Sheets

(51) Int. Cl.
*H01L 27/32* (2006.01)
*H01L 23/48* (2006.01)

(52) U.S. Cl.
CPC .... *G02F 1/13454* (2013.01); *G02F 1/133305* (2013.01); *G02F 2001/133302* (2013.01); *G02F 2201/42* (2013.01); *H01J 2329/4686* (2013.01)

(58) Field of Classification Search
CPC .............. G02F 2201/42; H01L 23/481; H01L 23/5226; H01L 23/5384; H05K 1/141; H01J 2329/4686
See application file for complete search history.

(56) References Cited

U.S. PATENT DOCUMENTS

| | | |
|---|---|---|
| 2013/0135328 A1 | 5/2013 | Rappoport et al. |
| 2016/0190389 A1 | 6/2016 | Lee et al. |
| 2017/0075174 A1* | 3/2017 | Lee ................. G02F 1/1339 |
| 2017/0117336 A1 | 4/2017 | Rappoport et al. |
| 2017/0221795 A1* | 8/2017 | Mei .................. H01L 23/481 |

OTHER PUBLICATIONS

Definition of the term "electronic." Downloaded from the American Heritage Dictionary on Oct. 18, 2019 from the website https://ahdictionary.com/word/search.html?q=electronic (Year: 2019).*

* cited by examiner

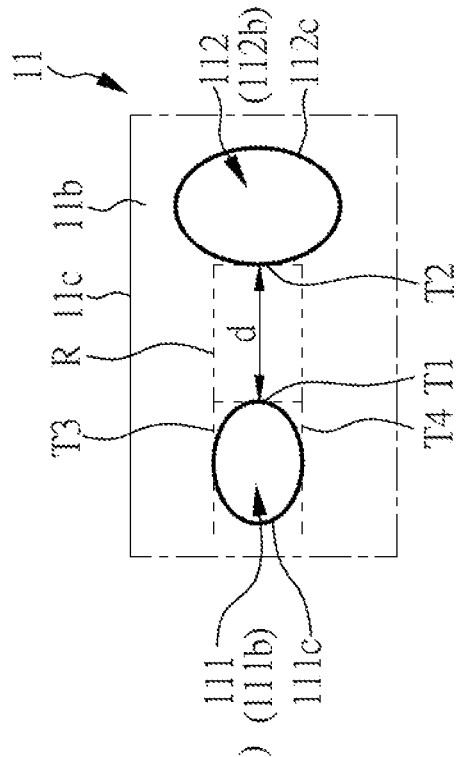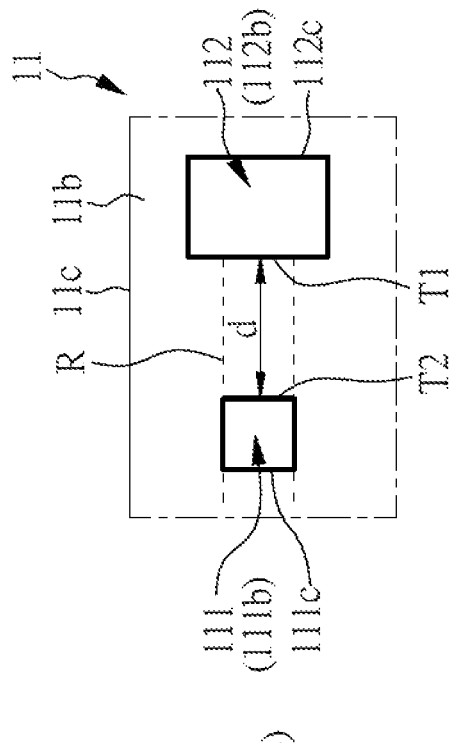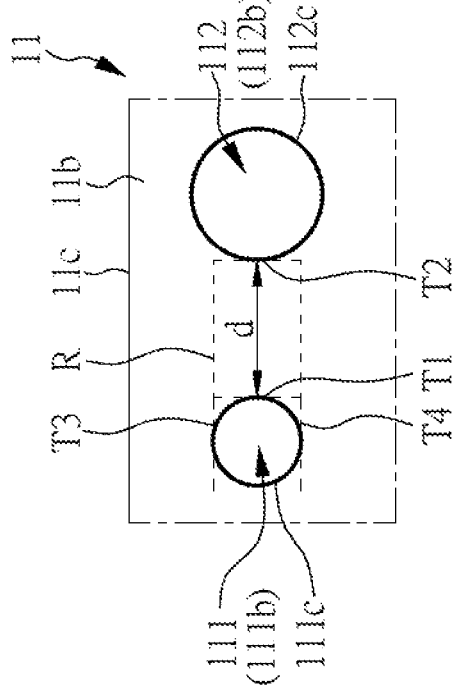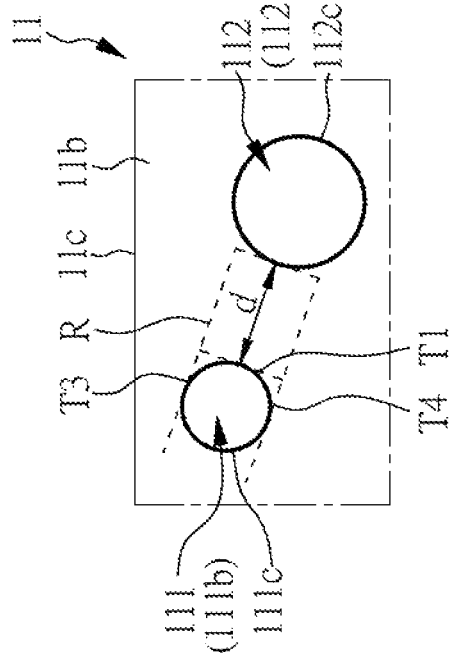

ELECTRONIC DEVICE

BACKGROUND

1. Field

The present disclosure relates to an electronic device and, more particularly, to an electronic device with a substrate having two different holes.

2. Description of Related Art

With the continuous advancement of technologies related to electronic devices, all the electronic devices are now developed toward compactness, thinness, and lightness. For example, thin display devices are the mainstream display devices on the market. Even though the available electronic devices on the market are compact, thin and/or light, efforts are still needed. For example, in the display devices, the circuit arrangement in the peripheral region still have to be optimized, to achieve the purpose of forming a display device with a narrow border region.

SUMMARY

The present disclosure provides an electronic device, which comprises: a substrate having a first surface and a second surface opposite to the first surface, wherein the substrate has a thickness denoted by t and a width denoted by WS; a first hole penetrating through the substrate, wherein the first hole has a first area on the first surface denoted by A1' and a second area on the second surface denoted by A1; and a second hole penetrating through the substrate, wherein the second hole has a third area on the first surface denoted by A2' and a fourth area on the second surface denoted by A2, and a distance between the first hole and the second hole is denoted by d, wherein values of the thickness t, the width WS, the first area A1', the second area A1, the third area A2', the fourth area A2, and the distance d are conformed to the following equation (I):

$$\frac{N \times \log((A1' + A1 + A2 + A2')/2)}{t} \leq \quad \text{(I)}$$
$$d < WS - \frac{N \times \log(A1' + A1 + A2 + A2')}{t}$$

wherein A1', A1, A2', and A2 are in the unit of μm², t and WS are in the unit of μm, and N is greater than 0 and less than 1E6.

Other novel features of the disclosure will become more apparent from the following detailed description when taken in conjunction with the accompanying drawings.

BRIEF DESCRIPTION OF THE DRAWINGS

FIG. 3A is a perspective view showing the relation between a first hole and a second hoe in Embodiment 1 of the present disclosure.

FIG. 3B to FIG. 3D are perspective views showing the relations between first holes and second holes in different embodiments of the present disclosure.

DETAILED DESCRIPTION OF EMBODIMENT

The following embodiments when read with the accompanying drawings are made to clearly exhibit the above-mentioned and other technical contents, features and/or effects of the present disclosure. Through the exposition by means of the specific embodiments, people would further understand the technical means and effects the present disclosure adopts to achieve the above-indicated objectives. Moreover, as the contents disclosed herein should be readily understood and can be implemented by a person skilled in the art, all equivalent changes or modifications which do not depart from the concept of the present disclosure should be encompassed by the appended claims.

Furthermore, the ordinals recited in the specification and the claims such as "first", "second" and so on are intended only to describe the elements claimed and imply or represent neither that the claimed elements have any proceeding ordinals, nor that sequence between one claimed element and another claimed element or between steps of a manufacturing method. The use of these ordinals is merely to differentiate one claimed element having a certain designation from another claimed element having the same designation.

Furthermore, the ordinals recited in the specification and the claims such as "above", "over", or "on" are intended not only directly contact with the other element, but also intended indirectly contact with the other element. Similarly, the ordinals recited in the specification and the claims such as "below", or "under" are intended not only directly contact with the other element but also intended indirectly contact with the other element.

In addition, the features in different embodiments of the present disclosure can be mixed to form another embodiment.

Embodiment 1

Figure 1:
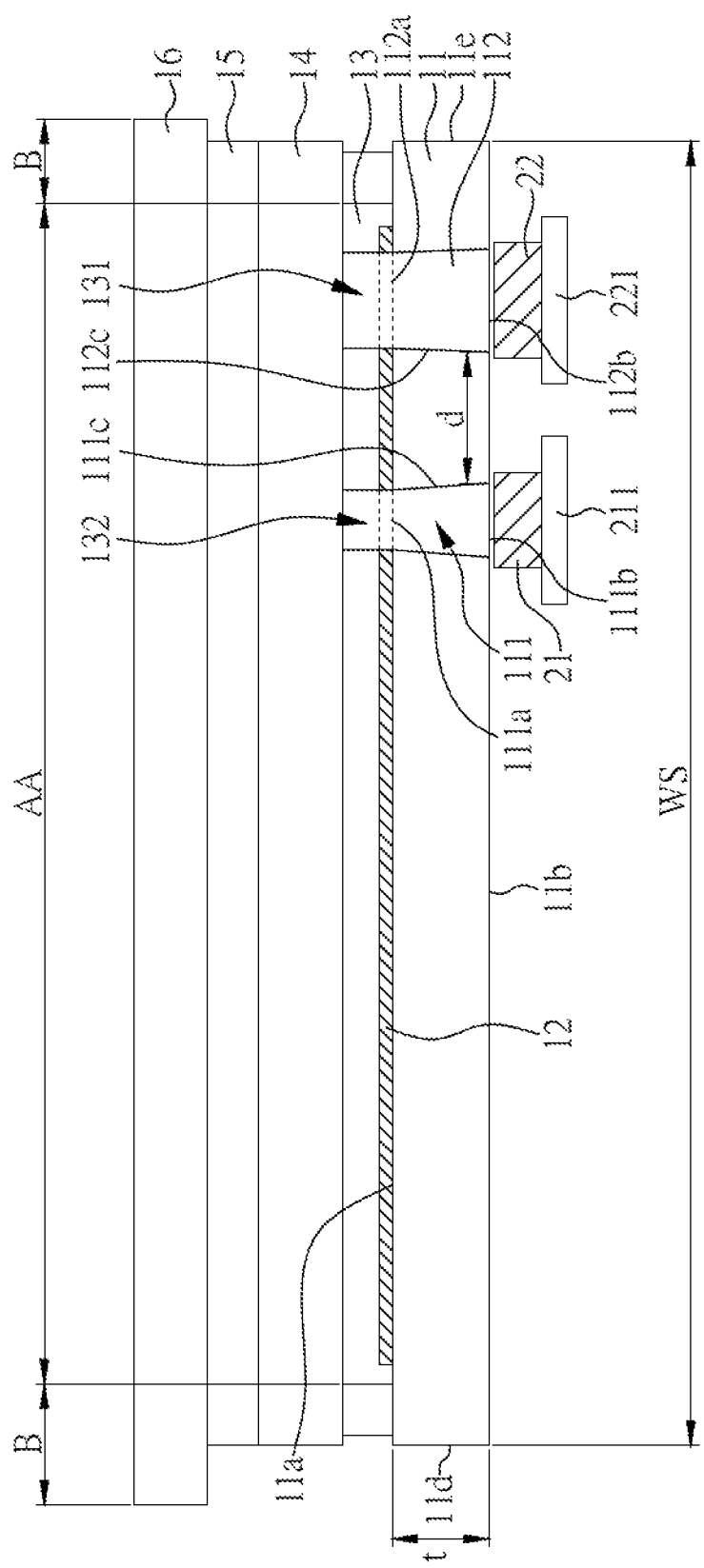
FIG. 1 is a cross-sectional view of an electronic device according to Embodiment 1 of the present disclosure.
Figure 2:
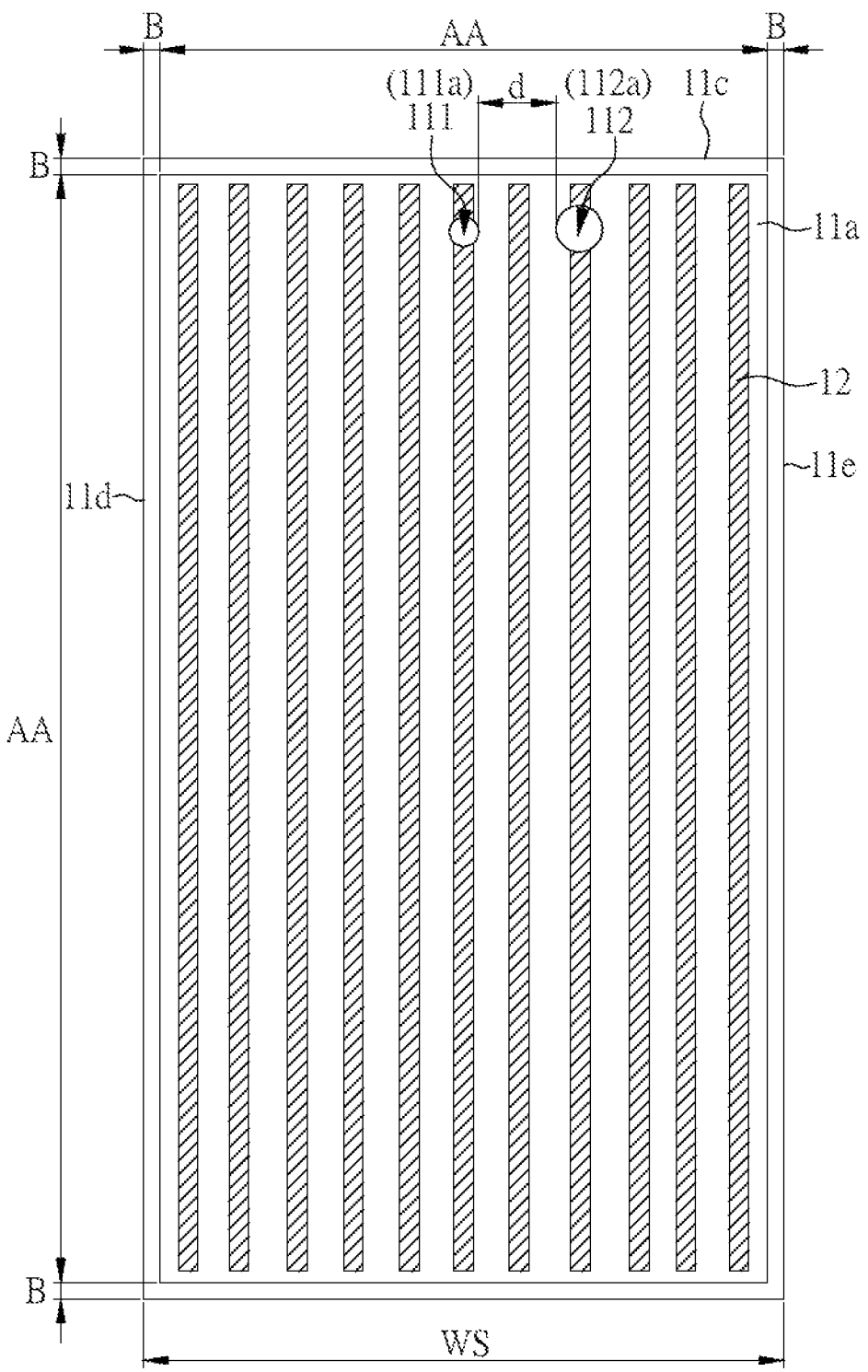
FIG. 2 is a top view of an electronic device according to Embodiment 1 of the present disclosure.

FIG. 1 and FIG. 2 are respectively a cross-sectional view and a top view of an electronic device of the present embodiment. The electronic device could be a display device or other types of device with electronic circuits. The electronic device of the present embodiment comprises: a substrate 11 having a first surface 11a and a second surface 11b opposite to the first surface 11a; a first hole 111 penetrating through the substrate 11; and a second hole 112 penetrating through the substrate 11. Herein, the first hole 111 has a first upper opening 111a on the first surface 11a and a first bottom opening 111b on the second surface 11b, and the second hole 112 has a second upper opening 112a on the first surface 11a and a second bottom opening 112b on the second surface 11b. As shown in FIG. 2, the shapes of the first upper opening 111a and the second upper opening 112a in the electronic device of the preset embodiment are circles. Even though the figures are not shown, the shapes of the first bottom opening 111b and the second bottom opening 112b are also circles. However, the present disclosure is not limited thereto. The shapes of the first upper opening 111a, the first bottom opening 111b, the second upper opening 112a and the second bottom opening 112b are not particularly limited, and can be a circle, an ellipse, a square, a rectangle, a polygon, or other irregular shape.

In the present disclosure, the first hole and the second hole refers to two holes that either a partial hole or a whole hole are not disposed between the first hole and the second hole. For example, FIG. 3A is a perspective view showing a relation between the first hole 111 and the second hole 112 in the electronic device of the present embodiment, in which either a partial hole or a whole hole are not disposed between the first hole 111 and the second hole 112.

More particularly, a distance d (which is a minimum distance on the second surface 11b) is between a first side wall 111c of the first hole 111 and a second side wall 112c of the second hole 112; a tangent line T1 perpendicular to the distance d of the first side wall 111c is defined; another tangent line T2 perpendicular to the distance d of the second side wall 112c is defined; and further two tangent lines T3, T4 parallel to the distance d of one of the first hole 111 and the second hole 112 which has smaller width at a direction perpendicular to the distance d (in the present embodiment, the tangent lines T3, T4 are tangent lines of the first hole 111) are also defined. A region R is defined by the tangent lines T1, T2, T3, T4, and either a partial hole or a whole hole are not disposed in the region R.

FIG. 3B to FIG. 3D are perspective views showing the relations between first holes and second holes in different embodiments of the present disclosure. The definitions of the regions R shown in FIG. 3B to FIG. 3D are similar to that stated above, and are not repeated again. In addition, in FIG. 2, FIG. 3A, FIG. 3B and FIG. 3D, the first hole 111 and the second hole 112 are arranged approximately parallel to the extension direction of an edge 11c of the substrate 11; and more specifically, a connection between centers of the first hole 111 and the second hole 112 are arranged approximately parallel to the extension direction of the edge 11c. However, the present disclosure is not limited thereto. In other embodiments of the present disclosure, as shown in FIG. 3C, the first hole 111 and the second hole 112 can be arranged not parallel to the extension direction of an edge 11c of the substrate 11; and more specifically, a connection between centers of the first hole 111 and the second hole 112 are not arranged parallel to the extension direction of the edge 11c. Furthermore, in the case shown in FIG. 3D, if the first hole 111 or the second hole 112 has a shape of a square, a rectangle or a polygon, the tangent lines T3, T4 can be an extension line of two edges of the first hole 111 or the second hole 112.

As shown in FIG. 1, the electronic device of the present embodiment further comprise: a circuit layer 12 disposed on the first surface 11a; a display medium layer 13 disposed on the circuit layer 12; a counter substrate 14 disposed on the display medium layer 13; an adhesive layer 15 disposed on the counter substrate 14; and a cover substrate 16 disposed on the adhesive layer 15. The circuit layer 12 can comprise plural transistors (not shown in the figure) to drive the display medium layer 13. In addition, the elements of the display device shown in the present embodiment are not limited to those stated above; other elements such as a polarizer film or touch units may also be interposed between any two elements stated above. For example, touch units (not shown in the figure) may be disposed on the substrate 11 to obtain an in-cell touch display device; touch units (not shown in the figure) may be disposed between the counter substrate 14 and the cover substrate 16 to obtain an on-cell touch display device; or touch units (not shown in the figure) may be disposed outside the cover substrate 16 to obtain an out-cell touch display device.

In the present embodiment, the substrate 11, the counter substrate 14 and the cover substrate 16 can be a quartz substrate, a glass substrate, a plastic substrate, other flexible substrates or films. When the substrate 11 and the counter substrate 14 are plastic substrates, flexible substrates or films, the electronic device of the present embodiment can be a flexible display device. In other embodiments of the present disclosure, the counter substrate 14 can be a barrier film or an encapsulating film; and the electronic device can be a flexible display device. In further other embodiments of the present disclosure, the cover substrate 16 can be a protection glass substrate or a polarizer.

In the present embodiment, the display medium layer 13 may comprise, but is not limited to organic light-emitting diodes (OLEDs), inorganic light-emitting diodes (LEDs), mini-meter sized light-emitting diodes (mini-LEDs), micro-meter sized light-emitting diodes (micro-LEDs), quantum-dot light-emitting diodes (QLEDs), or other self-emission type of display medium. In addition, the adhesive layer 15 can be an optical clear adhesive, an edge adhesive, a tape or other adhesion material.

In the present embodiment, the electronic device further comprises: a center region AA and a border region B adjacent to the center region AA, wherein at least a part of the first hole 111 or at least a part of the second hole 112 is disposed in the center region AA. Center region AA for a display device could be a display region. As shown in FIG. 1 and FIG. 2, in the electronic device of the present embodiment, the whole first hole 111 and the whole second hole 112 are disposed in the center region AA.

As the electronic device developed, the screen-to-body ratio is gradually increased. In the present embodiment, when at least a part of the first hole 111 or at least a part of the second hole 112 is disposed in the center region AA, a high screen-to-body ratio (a ratio of an area of center region AA to a sum of area of center region AA and area of border region B) can be achieved. Especially, when the whole first hole 111 and the whole second hole 112 are disposed in the center region AA, an approximately full screen-to-body ratio can be achieved.

As shown in FIG. 1, in the present embodiment, the substrate 11 has a thickness denoted by t and a width denoted by WS. The first hole 111 has a first area on the first surface 11a denoted by A1' and a second area on the second surface 11b denoted by A1; more specifically, the first upper opening 111a of the first hole 111 has a first area A1', and the first bottom opening 111b of the first hole 111 has a second area A1. The second hole 112 has a third area on the first surface 11a denoted by A2' and a fourth area on the second surface 11b denoted by A2; more specifically, the second upper opening 112a of the second hole 112 has a third area A2', and the second bottom opening 112b of the second hole 112 has a fourth area A2. Herein, the first area A1', the second area A1, the third area A2' and the fourth area A2 can be observed from a top view from the first surface 11a and a bottom view from the second surface 11b, such as the figures shown in FIG. 2 and FIG. 3A to FIG. 3D. A distance between the first hole 111 and the second hole 112 is denoted by d; more specifically, the distance d is a minimum distance on the second surface 11b between a first side wall 111c of the first hole 111 and a second side wall 112c of the second hole 112. Herein, values of the thickness t, the width WS, the first area A1', the second area A1, the third area A2', the fourth area A2, and the distance d are conformed to the following equation (I):

$$\frac{N \times \log((A1' + A1 + A2 + A2')/2)}{t} \leq d < WS - \frac{N \times \log(A1' + A1 + A2 + A2')}{t} \quad (I)$$

wherein A1', A1, A2', and A2 are in the unit of $\mu m^2$, t and WS are in the unit of $\mu m$, and N is a coefficient with no unit, and value of N is greater than 0 and less than 1E6 (1,000,000).

In the present embodiment, the first hole 111 and the second hole 112 are disposed in the substrate 11, which may cause the anti-bending strength of the substrate 11 decreased. If the distance d is below the lower limit defined by the equation (I), the substrate 11 does not have enough anti-bending strength, and may be easily broken. In addition, if the distance d is below the lower limit defined by the equation (I), the substrate 11 may be easily broken at the position between the first hole 111 and the second hole 112 during the process for forming the first hole 111 and the second hole 112. If the distance is exceed the upper limit defined by the equation (I), the first hole 111 and the second hole 112 may be too close to edges of the substrate 11, and the substrate 11 may also be easily broken. Hence, when the distance d is within the range defined by the equation (I), the substrate 11 can have enough anti-bending strength; and therefore, the durability of the electronic device can be maintained.

In the present disclosure, the coefficient N depends upon the first area A1', the second area A1, the third area A2' and the fourth area A2.

In one aspect of the present disclosure, an average of the first area A1' and the second area A1 is defined as a first average, an average of the third area A2' and the fourth area A2 is defined as a second average, and N is equal to 9E2 (900) when at least one of the first average and the second average is greater than 3 $\mu m^2$ and less than 1E4 (10,000) $\mu m^2$.

In another aspect of the present disclosure, an average of the first area A1' and the second area A1 is defined as a first average, an average of the third area A2' and the fourth area A2 is defined as a second average, and N is equal to 9E3 (9,000) when at least one of the first average and the second average is greater or equal to 1E4 (10,000) $\mu m^2$ and less than 1E6 (1,000,000) $\mu m^2$.

In further another aspect of the present disclosure, an average of the first area A1' and the second area A1 is defined as a first average, an average of the third area A2' and the fourth area A2 is defined as a second average, and N is equal to 9E4 (90,000) when at least one of the first average and the second average is greater or equal to 1E6 (1,000,000) $\mu m^2$ and less than 1E7 (10,000,000) $\mu m^2$.

In further another aspect of the present disclosure, an average of the first area A1' and the second area A1 is defined as a first average, an average of the third area A2' and the fourth area A2 is defined as a second average, and N is equal to 9E5 (900,000) when at least one of the first average and the second average is greater or equal to 1E7 (10,000,000) $\mu m^2$ and less than 6.4E7 (64,000,000) $\mu m^2$.

In the present disclosure, the first area A1', the second area A1, the third area A2', the fourth area A2, the thickness t and the width WS can be measured by an optical microscope (OM) or a scanning electron microscope (SEM). When the optical microscope is used, the back illuminator is close, and the front illuminator is open. The first area A1', the second area A1, the third area A2' and the fourth area A2 can be observed viewing from a perpendicular direction of the substrate 11, for example, a top view from the first surface 11a and a bottom view from the second surface 11b, such as the figures shown in FIG. 2 and FIG. 3A to FIG. 3D. In addition, the observed dark zones are the first hole and the second hole.

In the electronic device of the present embodiment, the display medium layer 13 has a first signal passing tunnel 131 connecting to the second hole 112. In addition, the display medium layer 13 further has a second signal passing tunnel 132 connecting to the first hole 111. Herein, the first signal passing tunnel 131 and the second hole 112 together form a hollow tunnel, and signal can pass through the hollow tunnel. Also, the second signal passing tunnel 132 and the first hole 111 together form another hollow tunnel, and signal can pass through the hollow tunnel.

In the present embodiment, the electronic device may further comprise a first electronic unit 21 disposed on the second surface 11b and corresponding to the first hole 111 and a second electronic unit 22 disposed on the second surface 11b and corresponding to the second hole 112. More specifically, the first electronic unit 21 corresponds to the first hole 111, and is disposed under the first substrate 11 and outside the first hole 111. The second electronic unit 22 corresponds to the second hole 112, and is disposed under the first substrate 11 and outside the second hole 112. In addition, the display medium layer 13 and the first electronic unit 21 are disposed on two opposite sides of the first substrate 111, the first hole 111 is disposed between the first electronic unit 21 and the second signal passing tunnel 132, and the second hole 112 is disposed between the second electronic unit 22 and the first signal passing tunnel 131. However, the present disclosure is not limited thereto. In other embodiments of the present disclosure, at least a part of the first electronic unit 21 may be disposed in the first hole 111, and/or at least a part of the second electronic unit 22 may be disposed in the second hole 112.

In other embodiments of the present disclosure, even not shown in the figures, the hollow tunnel formed by the first signal passing tunnel 131 and the second hole 112 and/or formed by the second signal passing tunnel 132 and the first hole 111 can be extended into the counter substrate 14, which means that the counter substrate 14 may have hole(s) corresponding to the first hole 111 and/or the second hole 112. In further other embodiments of the present disclosure, even not shown in the figures, the hollow tunnel formed by the first signal passing tunnel 131 and the second hole 112 and/or formed by the second signal passing tunnel 132 and the first hole 111 can be extended into the counter substrate 14 and further into the adhesive layer 15, which means that the counter substrate 14 and the adhesive layer 15 may respectively have hole corresponding to the first hole 111 and/or the second hole 112. In this case, more signals can reach to the first electronic unit 21 and/or the second electronic unit 22.

In addition, in the present embodiment, a first circuit board 211 can electrically connect to the first electronic unit 21, and a second circuit board 221 can electrically connect to the second electronic unit 22.

In the present embodiment, the first electronic unit 21 and the second electronic unit 22 can respectively a camera or a photo sensor receiving light signal such as visible light, IR light or UV light. Herein, the first signal passing tunnel 131 and the second hole 112 together form a hollow tunnel, and the second signal passing tunnel 132 and the first hole 111 together form another hollow tunnel. Hence, if the first electronic unit 21 and the second electronic unit 22 respectively is a camera or a photo sensor, light or photo signals can pass through these two hollow tunnels to achieve the first electronic unit 21 and the second electronic unit 22. However, the present disclosure is not limited thereto. In other embodiments of the present disclosure, the first electronic unit 21 and the second electronic unit 22 can respectively be a gate driver IC, a data driver IC, a timing controller IC (TCON), or other electronic unit receiving electrical signal.

Herein, the first electronic unit 21 and the second electronic unit 22 can be disposed under the first substrate 11 with or without a binder (not shown in the figure). If the first electronic unit 21 and the second electronic unit 22 are disposed under the first substrate 11 without a binder, the positions of the first electronic unit 21 and the second electronic unit 22 can be fixed with other units such as a frame, a backboard or the like (not shown in the figure).

Embodiment 2

Figure 4:
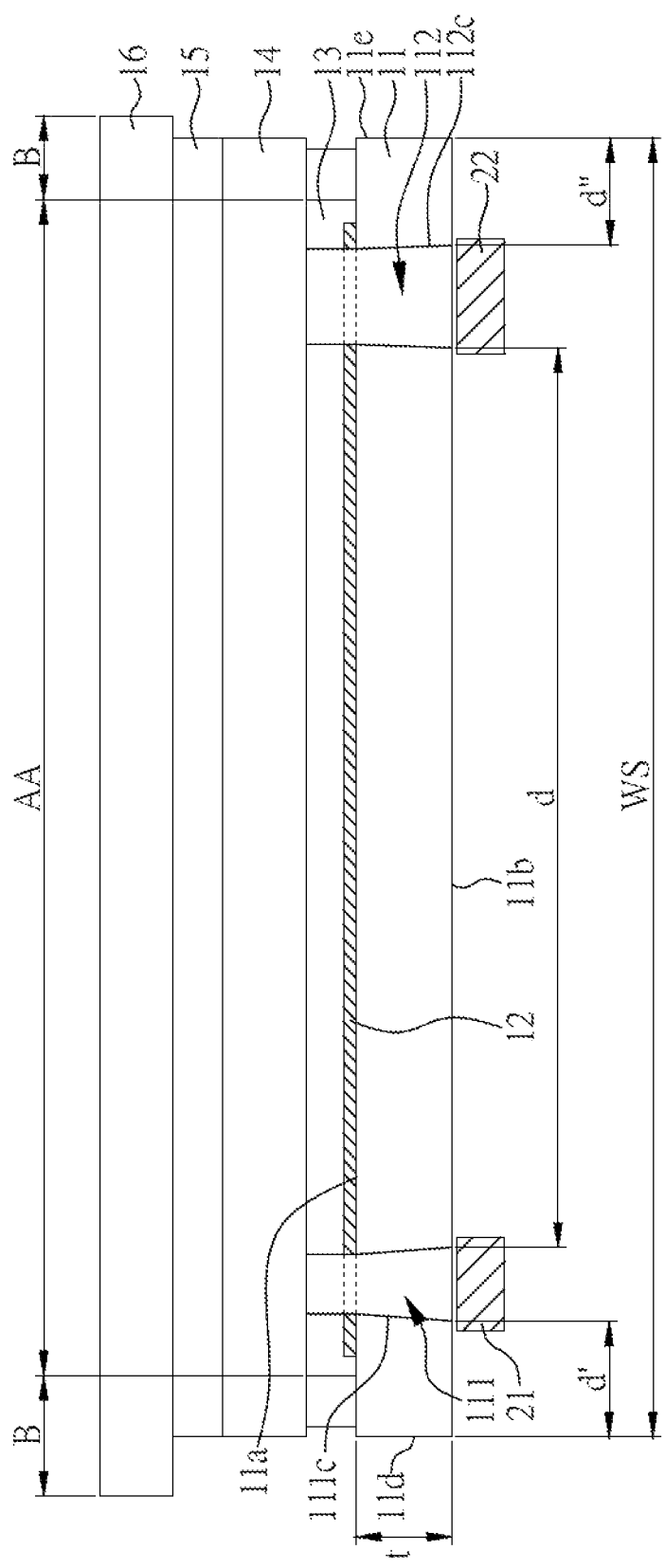
FIG. 4 is a cross-sectional view of an electronic device according to Embodiment 2 of the present disclosure.
Figure 5:
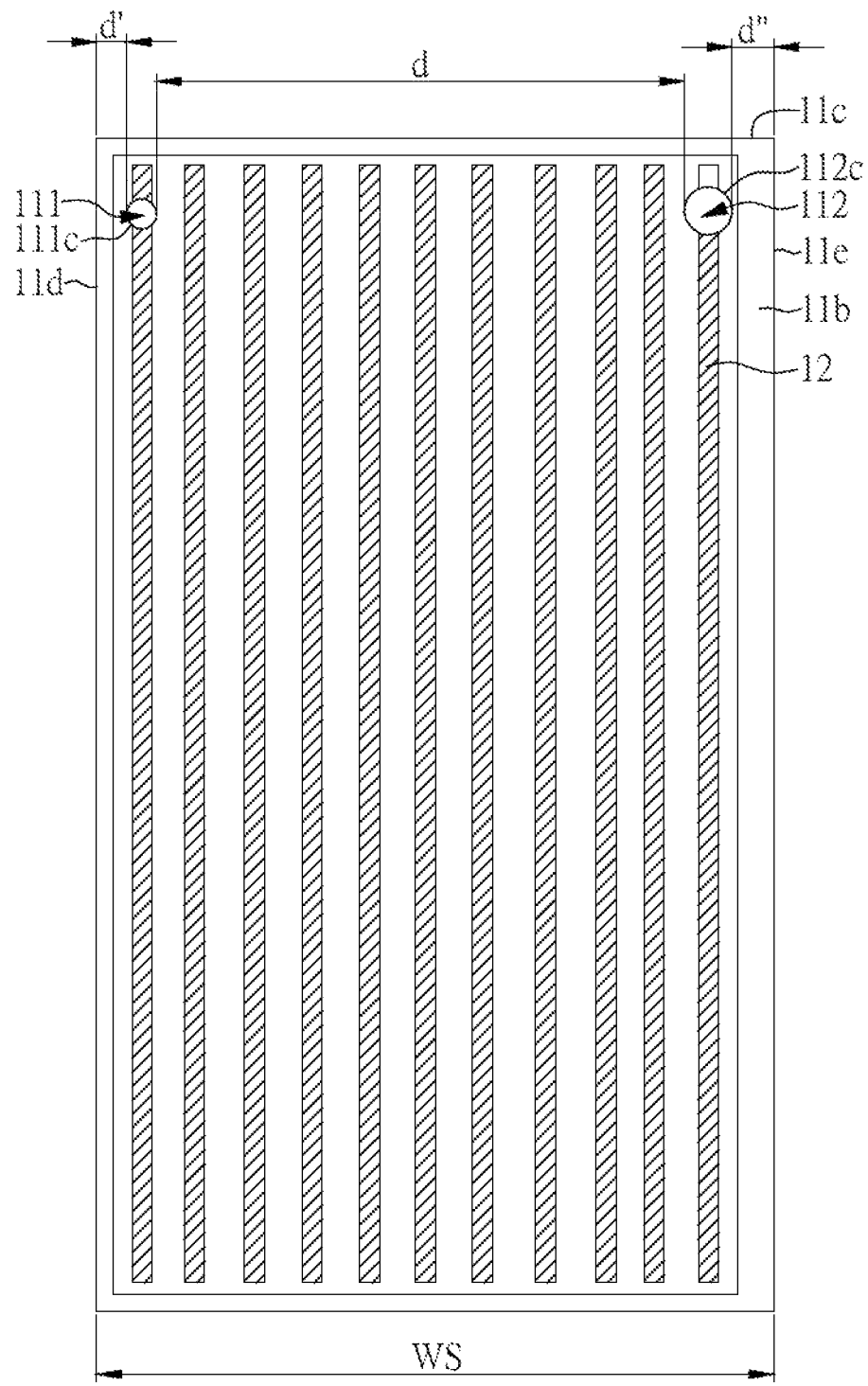
FIG. 5 is a top view of an electronic device according to Embodiment 2 of the present disclosure.

FIG. 4 and FIG. 5 are respectively a cross-sectional view and a top view of an electronic device of the present embodiment. The electronic device of the present embodiment is similar to that shown in Embodiment 1, except for the positions of the first hole.

As shown in FIG. 1 and FIG. 2, the substrate 11 has a first edge 11d and a second edge 11e opposite to the first edge 11d. The first hole 111 and the second hole 112 are not close to a first edge 11d and a second edge 11e of the substrate 11.

However, as shown in FIG. 4 and FIG. 5 of the present embodiment, the first hole 111 is adjacent to the first edge 11d of the first substrate, and the second hole 112 is adjacent to the second edge 111e of the substrate 11. More specifically, the first hole 111 is relatively close to the first edge 11d compared to the second hole 112, and the second hole 112 is relatively close to the second edge 11e compared to the first hole 111.

Herein, a first minimum distance d' between the first edge 11d and a first side wall 111c of the first hole 111 is donated by d', and a second minimum distance d" between the second edge 11e and a second sidewall 112c of the second hole 112 is donated by d", and values of the first minimum distance d', the second minimum distance d", the thickness t, the first area A1', the second area A1, the third area A2' and the fourth area A2 are conformed to the following equations (II) and (III):

$$d' \geq \frac{N \times \log(A2 + A2')}{t} \quad \text{(II)}$$

$$d'' \geq \frac{N \times \log(A1 + A1')}{t} \quad \text{(III)}$$

wherein d and d" are in the unit of μm.

In the present embodiment, because the first hole 111 and the second hole 112 are respectively adjacent to the first edge 11d and the second edge 11e of the substrate 11, the substrate 11 may be easily broken if the first hole 111 and the second hole 112 are too close to the first edge 11d and the second edge 11e. Hence, the first minimum distance d' between the first edge 11d and the first side wall 111c of the first hole 111 as well as the second minimum distance d" between the second edge 11e and the second sidewall 112c of the second hole 112 have to satisfy the aforementioned equations (II) and (III) to prevent the fracture of the substrate 11 at the position near to the first hole 111 and the second hole 112.

In addition, values of the width WS, the first minimum distance d', the second minimum distance d", and the distance d are conformed to the following equation (IV):

Embodiment 3

$$d \leq WS - (d' + d'') - \sqrt{\frac{(A1 + A1' + A2 + A2')}{2}}. \quad \text{(IV)}$$

Figure 6:
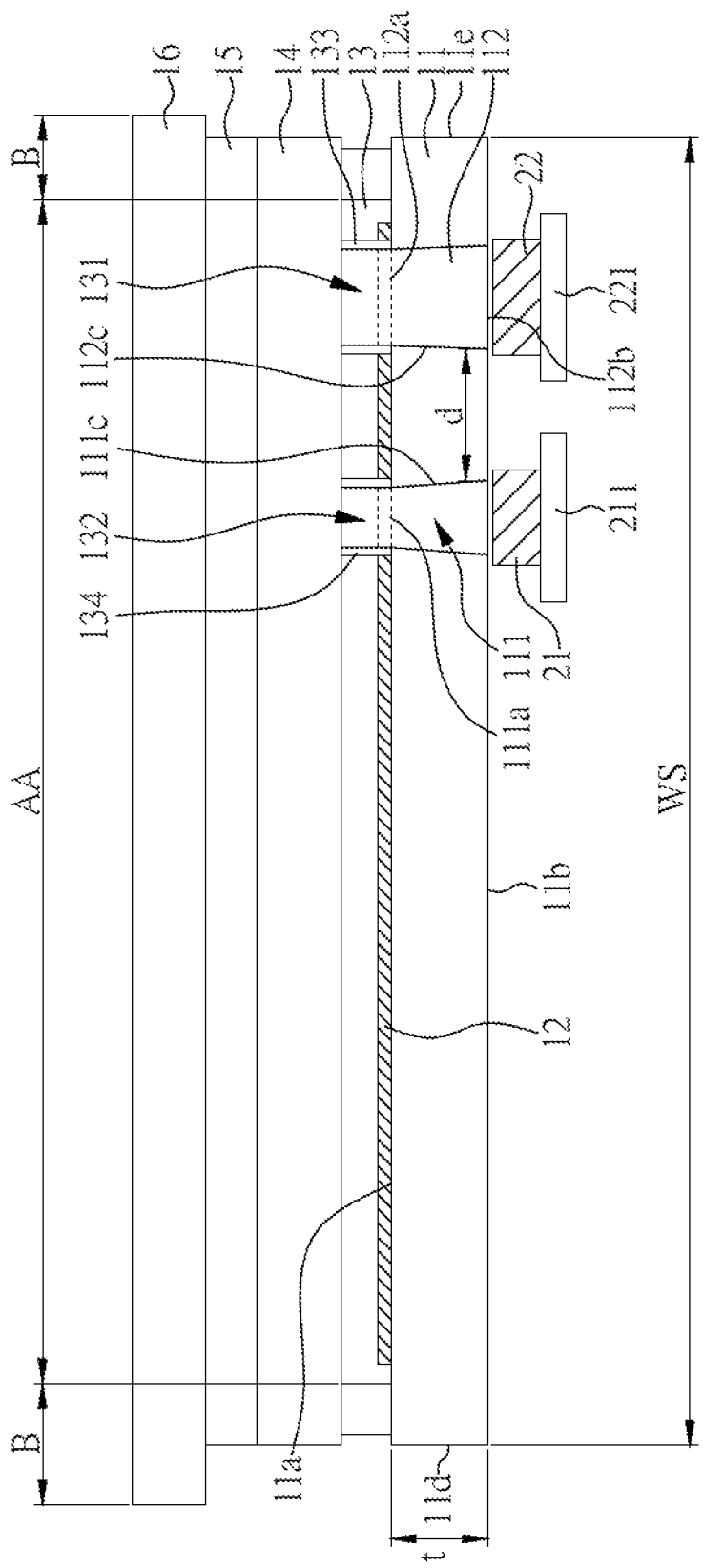
FIG. 6 is a cross-sectional view of an electronic device according to Embodiment 3 of the present disclosure.

FIG. 6 is a cross-sectional view of an electronic device of the present embodiment. The electronic device of the present embodiment is similar to that shown in Embodiment 1, except that the display media are different.

In the present embodiment, the display medium layer 13 may comprise liquid crystals (LCs). Because the liquid crystals are in fluid form, dam units 133, 134 are disposed in the display medium layer 13. More specifically, the first signal passing tunnel 131 is formed by the dam unit 133 formed in the display medium layer 13, and the second signal passing tunnel 132 is formed by the dam unit 134 formed in the display medium layer 13. Therefore, the purpose of preventing liquid crystals flow into the first hole 111 and the second hole 112 can be achieved.

Embodiment 4

Figure 7:
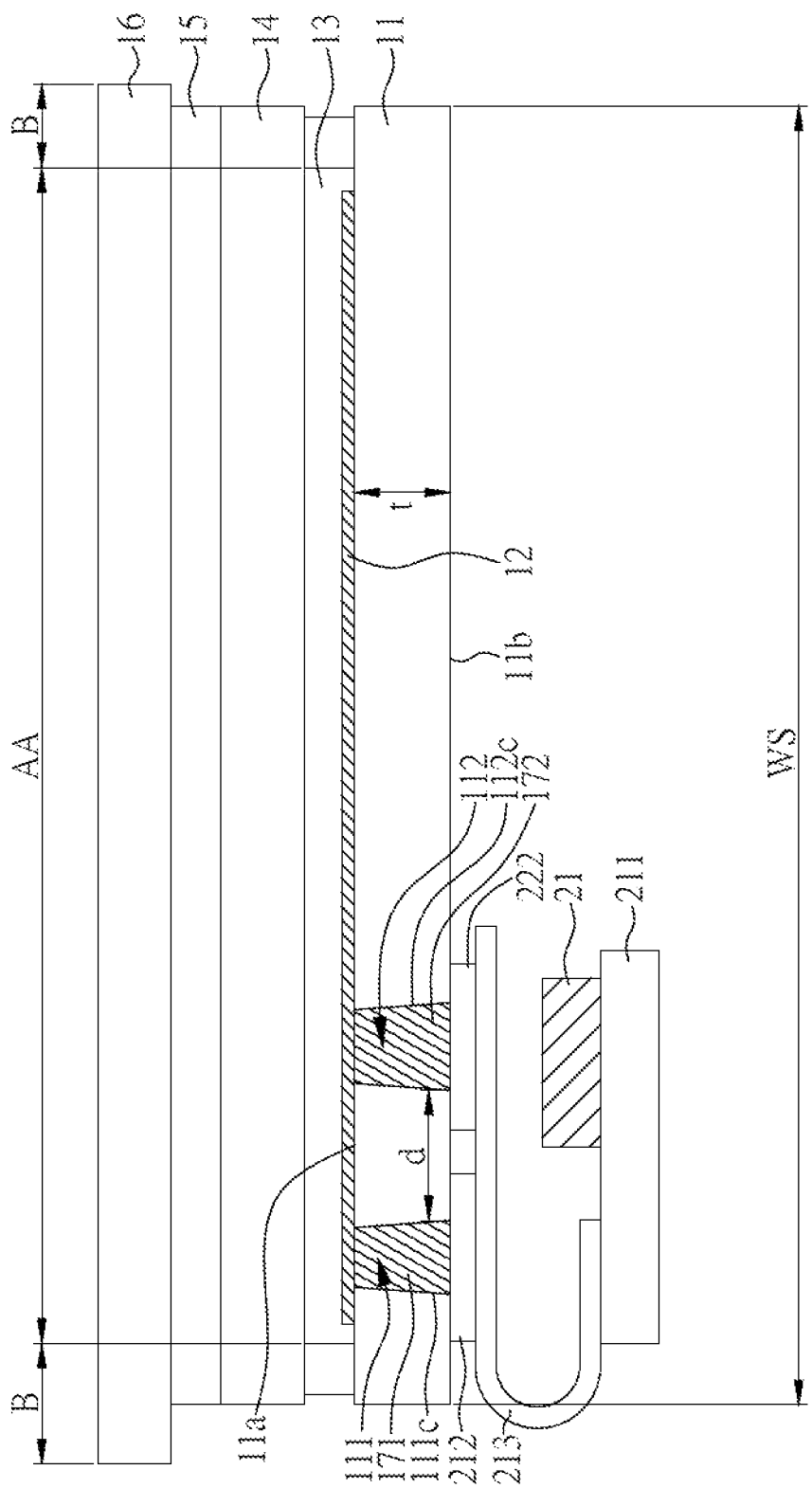
FIG. 7 is a cross-sectional view of an electronic device according to Embodiment 4 of the present disclosure.

FIG. 7 is a cross-sectional view of an electronic device of the present embodiment. The electronic device of the present embodiment is similar to that shown in Embodiment 1, except for the following differences.

In the electronic device of the present embodiment, the first signal passing tunnel and the second signal passing tunnel are not disposed in the display medium layer 13.

In addition, in the electronic device of the present embodiment, a first conductive element 171 is disposed in the first hole 111, and the first conductive element 171 electrically connects to the circuit layer 12. A second conductive element 172 is disposed in the second hole 112, and the second conductive element 172 electrically connects to the circuit layer 12. The electronic device of the present embodiment further comprises a first electronic unit 21 disposed under the second surface 11b, wherein the first electronic unit 21 electrically connects to the circuit layer 12 via the first conducive element 171 and the second conductive element 172.

In the present embodiment, the first conductive element 171 and the second conductive element 172 fill the whole first hole 111 and the whole second hole 112. However, the present disclosure is not limited thereto. In other embodiments of the present disclosure, the first conductive element 171 and/or the second conductive element 172 can only form on the first side wall 111c of the first hole 111 and/or the second side wall 112c of the second hole 112.

Furthermore, in the present embodiment, a first metal layer 212 (which can be a circuit layer or a metal pad) and a second metal layer 222 (which can be a circuit layer or a metal pad) can be further disposed on the second surface 11b of the substrate 11, and the first conductive element 171 and the second conductive element 172 electrically connect to a third circuit board 213 (in the present embodiment, a flexible circuit board) via the first metal layer 212 and the second metal layer 222. In addition, the first electronic unit 21 electrically connects to the third circuit board 213 via a first circuit board 211. However, the electrical connections between the first electronic unit 21 and the first conductive element 171 and between the first electronic unit 21 and the second conductive element 172 are not limited thereto.

Embodiment 5

Figure 8:
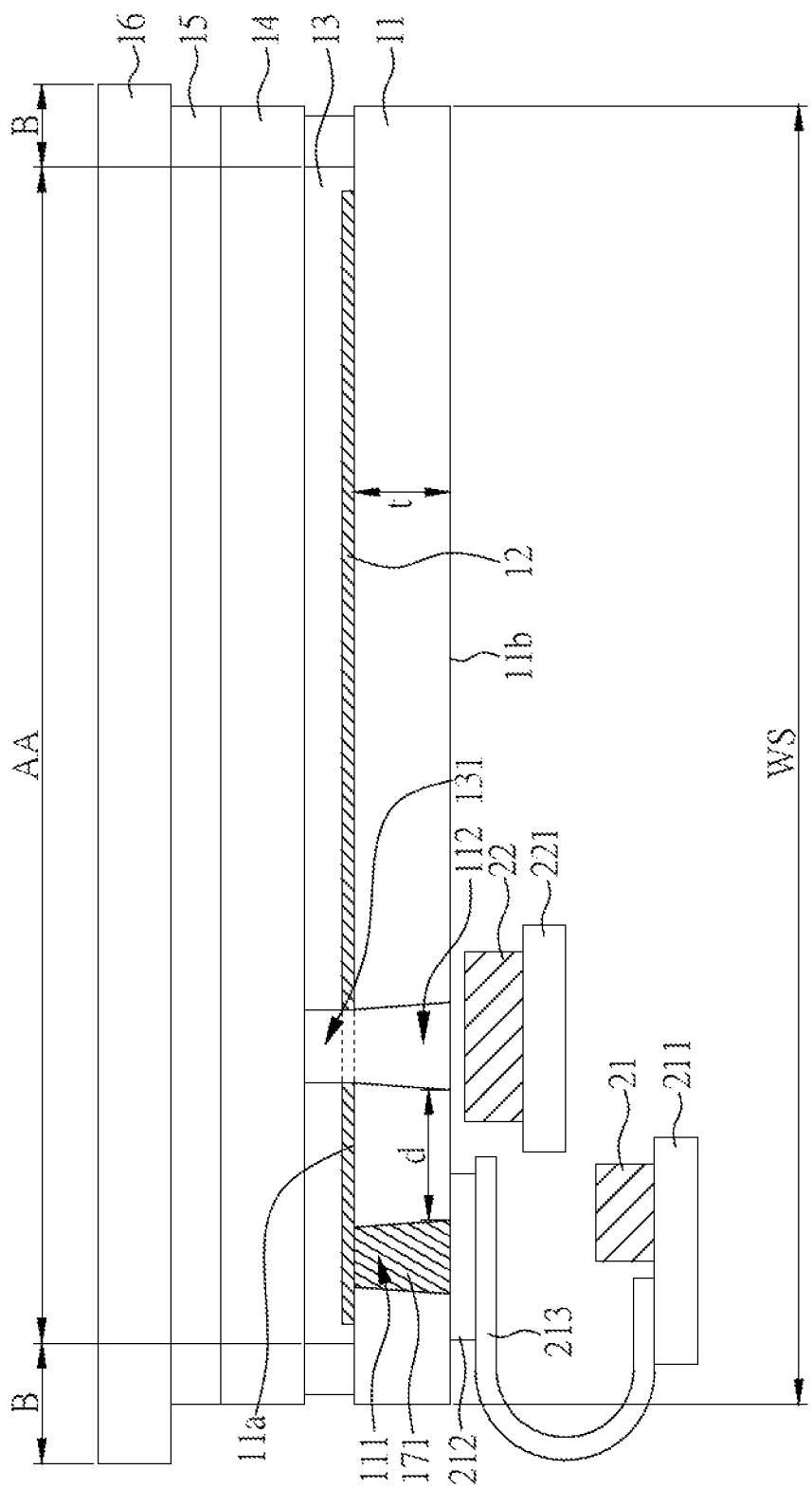
FIG. 8 is a cross-sectional view of an electronic device according to Embodiment 5 of the present disclosure.

FIG. 8 is a cross-sectional view of an electronic device of the present embodiment. The electronic device of the present embodiment is similar to that shown in Embodiment 4, except for the following differences.

In the present embodiment, only the first hole 111 is disposed with the first conductive element 171, and the first conductive element 171 electrically connects to the circuit layer 12. Hence, the first electronic unit 21 electrically connects to the circuit layer 12 via the first conductive element 171, the first metal layer 212 (which can be a circuit layer or a metal pad), the third circuit board 213 (in the present embodiment, a flexible circuit board) and the first circuit board 211.

On the other hand, the second hole 112 is a hollow hole, and the display medium layer 13 has the first signal passing tunnel 131 connecting to the second hole 112. The first signal passing tunnel 131 and the second hole 112 together form a hollow tunnel, and signal can pass through the hollow tunnel. The second hole 112 is disposed between the first signal passing tunnel 131 and the second electronic unit 22.

Hence, in the present embodiment, the first electronic unit 21 can be a gate driver IC, a data driver IC, a timing controller IC (TCON), or other electronic unit receiving electrical signal; and the second electronic unit 22 corresponds to the second hole 112 can be a camera or a photo sensor receiving light signal such as visible light, IR light or UV light.

Embodiment 6

Figure 9:
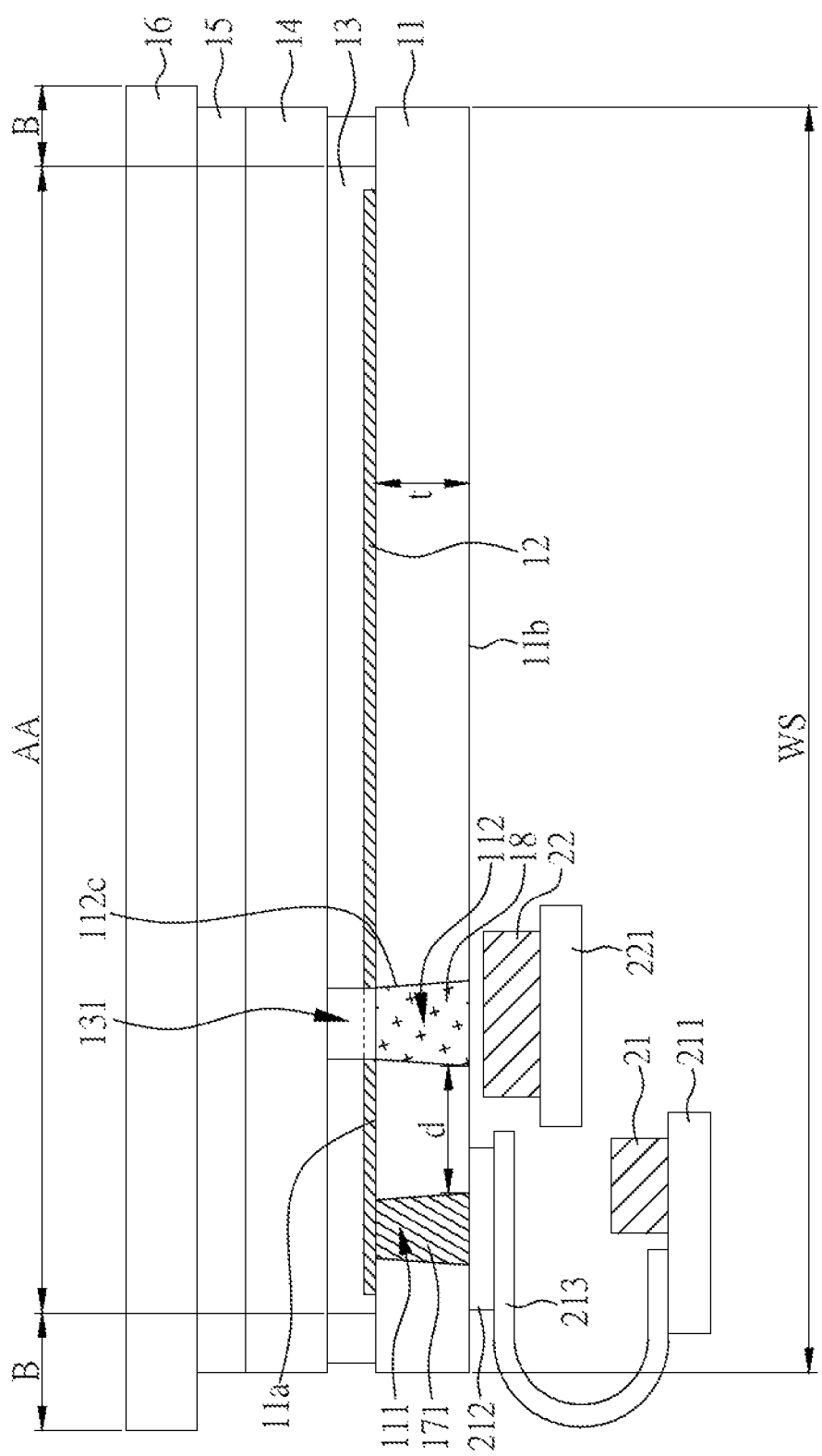
FIG. 9 is a cross-sectional view of an electronic device according to Embodiment 6 of the present disclosure.

FIG. 9 is a cross-sectional view of an electronic device of the present embodiment. The electronic device of the present embodiment is similar to that shown in Embodiment 5, except for the following differences.

In the present embodiment, an optical element 18 is further disposed in the second hole 112. The optical element 18 can be a filter with optical filter property, a micro lens for light collection, or other material with high transparency; but the present disclosure is not limited thereto.

In other embodiments of the present disclosure, even not shown in the figures, the hollow tunnel formed by the first signal passing tunnel 131 and the second hole 112 can be extended into the counter substrate 14, which means the counter substrate 14 has a hole corresponding to the second hole 112. In further other embodiments of the present disclosure, even not shown in the figures, the hollow tunnel formed by the first signal passing tunnel 131 and the second hole 112 can further be extended into the counter substrate 14 and further into the adhesive layer 15, which means the counter substrate 14 and the adhesive layer 15 respectively have holes corresponding to the second hole 112. In this case, the optical element 18 may be selectively disposed in the hole of the counter substrate 14.

In the present embodiment, the optical element 18 fills the whole second hole 112. However, in other embodiments of the present disclosure, the optical element 18 can be only formed on the second side wall 112c of the second hole 112.

Figure 10C:
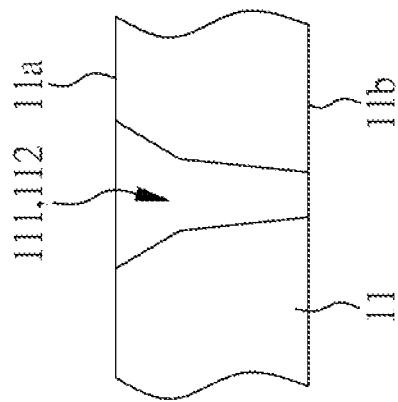
FIG. 10A to FIG. 10C are cross-sectional views showing holes with different shapes in other embodiments of the present disclosure.
Figure 10B:
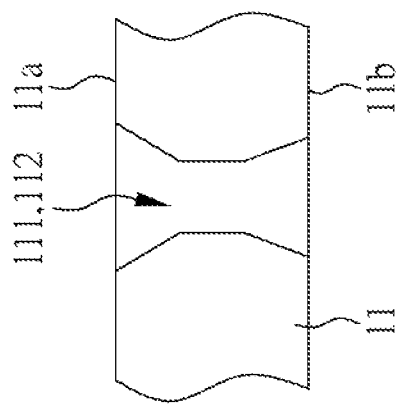
Figure 10A:
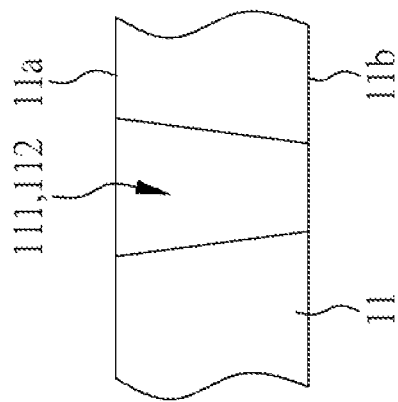

The shapes of the first hole 111 and the second hole 112 are not limited to those shown in FIG. 1 to FIG. 9. FIG. 10A to FIG. 10B are cross-sectional views showing holes with different shapes in other embodiments of the present disclosure. In other embodiments of the present disclosure, the shapes of the first hole 111 and the second hole 112 from the cross sectional view of the electronic device can be a rectangle, a trapezoid, an inversed trapezoid as shown in FIG. 10A, a dumbbell shape as shown in FIG. 10B, a funnel shape as shown in FIG. 10C or other irregular shape.

The electronic device made as described in any of the embodiments of the present disclosure as described previously can be co-used with a touch panel to form a touch electronic device. Meanwhile, a display device or touch display device may be applied to any electronic devices known in the art that need a display screen, such as displays, mobile phones, laptops, video cameras, still cameras, music players, mobile navigators, TV sets, and other electronic devices that display images.

In the aforesaid embodiments, the electronic devices are exemplified. However, the present disclosure is not limited thereto. In other embodiments of the present disclosure, the substrate with the aforementioned features can be applied to any other electronic devices to obtain electronic devices with improved compactness, thinness and/or lightness Although the present disclosure has been explained in relation to its embodiment, it is to be understood that many other possible modifications and variations can be made without departing from the spirit and scope of the disclosure as hereinafter claimed.

What is claimed is:

1. An electronic display device, comprising:
   an insulating substrate having a first surface and a second surface opposite to the first surface, wherein the insulating substrate has a thickness denoted by t and a width denoted by WS;
   a display medium layer disposed on the first surface;
   a first hole penetrating through the insulating substrate, wherein the first hole has a first area on the first surface denoted by A1' and a second area on the second surface denoted by A1; and
   a second hole penetrating through the insulating substrate, wherein at least part of the first hole and at least part of the second hole are located in a display region, the second hole has a third area on the first surface denoted by A2' and a fourth area on the second surface denoted by A2, and a distance between the first hole and the second hole is denoted by d,
   wherein values of the thickness t, the width WS, the first area A1', the second area A1, the third area A2', the fourth area A2, and the distance d are conformed to the following equation (I):

$$\frac{N \times \log((A1' + A1 + A2' + A2)/2)}{t} \leq \qquad (I)$$

$$d < WS - \frac{N \times \log(A1' + A1 + A2' + A2)}{t}$$

wherein A1', A1, A2', and A2 are in the unit of μm², t and WS are in the unit of μm, and N is greater than 0 and less than 1E6.

2. The electronic display device of claim 1, wherein an average of the first area A1' and the second area A1 is defined as a first average, an average of the third area A2' and the fourth area A2 is defined as a second average, and N is equal to 9E2 when at least one of the first average and the second average is greater than 3 μm² and less than 1E4 μm².

3. The electronic display device of claim 1, wherein an average of the first area A1' and the second area A1 is defined as a first average, an average of the third area A2' and the fourth area A2 is defined as a second average, and N is equal to 9E3 when at least one of the first average and the second average is greater or equal to 1E4 μm² and less than 1E6 μm².

4. The electronic display device of claim 1, wherein an average of the first area A1' and the second area A1 is defined as a first average, an average of the third area A2' and the fourth area A2 is defined as a second average, and N is equal to 9E4 when at least one of the first average and the second average is greater or equal to 1E6 μm² and less than 1E7 μm².

5. The electronic display device of claim 1, wherein an average of the first area A1' and the second area A1 is defined as a first average, an average of the third area A2' and the fourth area A2 is defined as a second average, and N is equal to 9E5 when at least one of the first average and the second average is greater or equal to 1E7 μm² and less than 6.4E7 μm².

6. The electronic display device of claim 1, wherein at least a part of the first hole or at least a part of the second hole is disposed in a center region of the electronic display device.

7. The electronic display device of claim 1, wherein the first area A1' on the first surface is different from the third area A2' on the first surface.

8. The electronic display device of claim 1, wherein the first area A1' on the first surface is different from the third area A2' on the first surface.

9. The electronic display device of claim 1, further comprising a first electronic unit and a second electronic unit disposed on the second surface, wherein the first hole is disposed under the first electronic unit, the second hole is disposed under the second electronic unit, the first electronic unit is a driver IC or a timing controller IC (TCON), and the second electronic unit is a camera or a photo sensor.

10. The electronic display device of claim 1, wherein the display medium layer has a first signal passing tunnel, the first hole is disposed between the first electronic unit and the first signal passing tunnel, and the first signal passing tunnel is formed by a dam unit formed in the display medium layer.

11. The electronic display device of claim 1, wherein the insulating substrate further has a first edge and a second edge opposite to the first edge, the first hole is adjacent to the first edge, a first minimum distance between the first edge and a first side wall of the first hole is donated by d', the second hole is adjacent to the second edge, and a second minimum distance between the second edge and a second sidewall of the second hole is donated by d", wherein values of the first minimum distance d', the second minimum distance d", the thickness t, the first area A1', the second area A1, the third area A2' and the fourth area A2 are conformed to the following equations (II) and (III):

$$d' \geq (N \times \log(A2+A2'))/t \qquad (II)$$

$$d'' \geq ((N \times \log(A1+A1'))/t \qquad (III)$$

wherein d' and d" are in the unit of μm.

12. The electronic display device of claim 11, wherein values of the width WS, the first minimum distance d', the second minimum distance d", and the distance d are conformed to the following equation (IV):

$$d \leq WS - (d'+d'') - \text{square root}((A1+A1'+A2+A2')/2) \qquad (IV).$$

13. The electronic display device of claim 1, further comprising a first electronic unit, and the display medium layer and the first electronic unit disposed on two opposite sides of the insulating substrate, wherein the display medium layer has a first signal passing tunnel, and the first hole is disposed between the first electronic unit and the first signal passing tunnel.

14. The electronic display device of claim 13, further comprising a second electronic unit, wherein the display medium layer further has a second signal passing tunnel, and the second hole is disposed between the second electronic unit and the second signal passing tunnel.

15. The electronic display device of claim 1, further comprising a circuit layer disposed on the first surface, a first conductive element disposed in the first hole, and a first electronic unit disposed on the second surface, wherein the first electronic unit is electrically connected to the circuit layer via the first conducive element.

16. The electronic display device of claim 15, further comprising a second conductive element disposed in the second hole, and a second electronic unit disposed on the second surface, wherein the second electronic unit is electrically connected to the circuit layer via the second conductive element.

* * * * *